(12) United States Patent
Kimura et al.

(10) Patent No.: US 9,160,334 B2
(45) Date of Patent: Oct. 13, 2015

(54) SEMICONDUCTOR DEVICE

(71) Applicant: SOCIONEXT INC., Yokohama-shi, Kanagawa (JP)

(72) Inventors: Takeshi Kimura, Yokohama (JP); Takeshi Moro, Ebina (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/185,430

(22) Filed: Feb. 20, 2014

(65) Prior Publication Data
US 2014/0320176 A1 Oct. 30, 2014

(30) Foreign Application Priority Data

Apr. 25, 2013 (JP) ................................. 2013-092470

(51) Int. Cl.
G05F 1/10 (2006.01)
G05F 3/02 (2006.01)
H03K 19/00 (2006.01)

(52) U.S. Cl.
CPC ........ *H03K 19/0013* (2013.01); *H03K 19/0016* (2013.01)

(58) Field of Classification Search
USPC .................................. 327/544, 534, 535, 537
See application file for complete search history.

(56) References Cited

U.S. PATENT DOCUMENTS

| 6,124,752 A | 9/2000 | Kuroda | |
|---|---|---|---|
| 7,994,858 B2* | 8/2011 | Standley et al. | 330/253 |
| 2006/0152283 A1* | 7/2006 | Dashtestani et al. | 330/256 |
| 2012/0319738 A1* | 12/2012 | Nakamura et al. | 327/102 |

FOREIGN PATENT DOCUMENTS

| JP | 03-216023 A | 9/1991 |
|---|---|---|
| JP | 09-326688 A | 12/1997 |
| JP | 2010-080807 A | 4/2010 |

* cited by examiner

*Primary Examiner* — Adam Houston
(74) *Attorney, Agent, or Firm* — Arent Fox LLP

(57) ABSTRACT

A semiconductor device includes: a transistor circuit including a power supply terminal and a back gate terminal; a variable resistance connected between a first voltage terminal and the power supply terminal; and a control circuit controlling the variable resistance based on a digital signal in which a difference voltage is converted when an absolute value of the difference voltage between a voltage of the first voltage terminal and a voltage of the back gate terminal is lower than a threshold value.

12 Claims, 13 Drawing Sheets

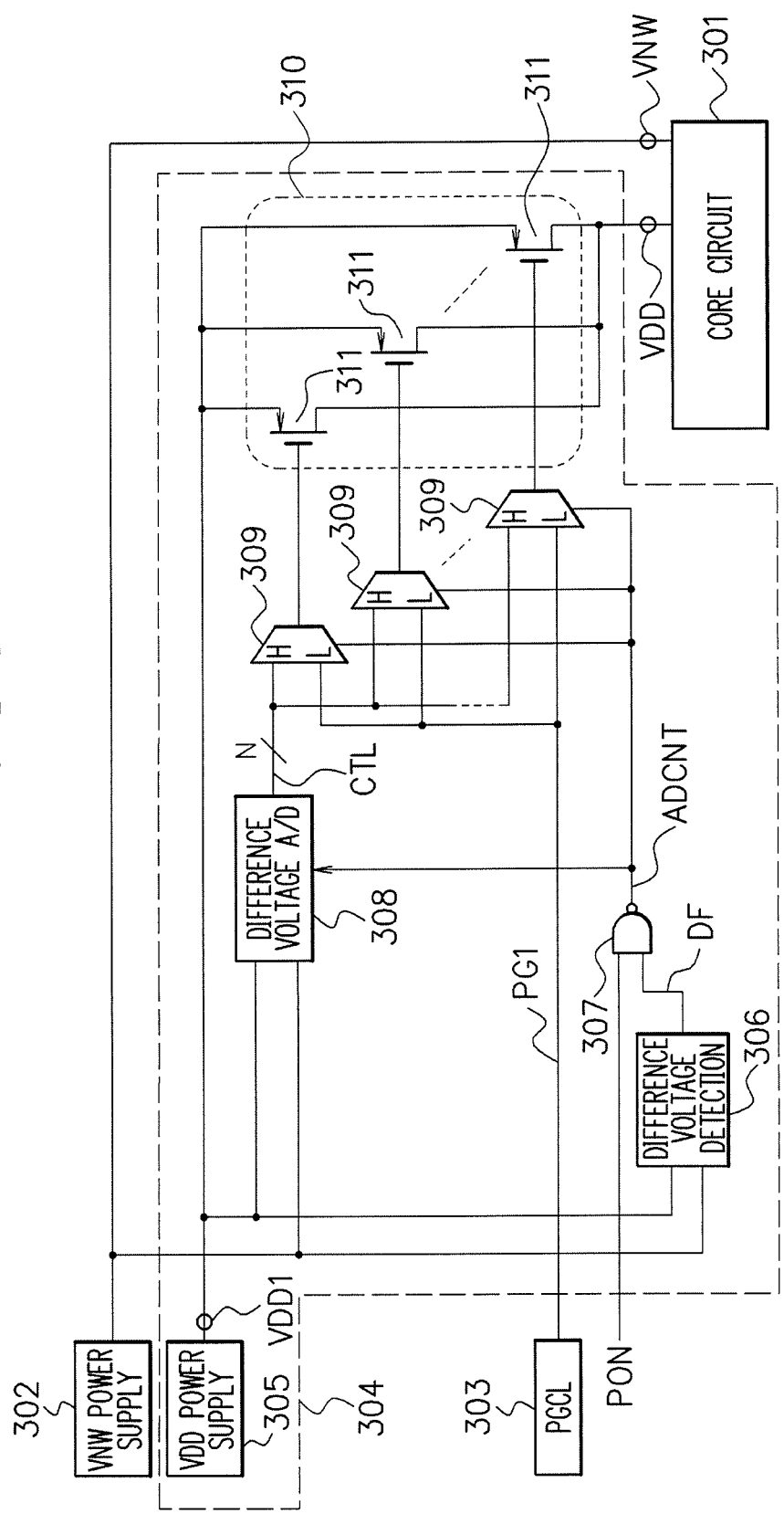

F I G. 6
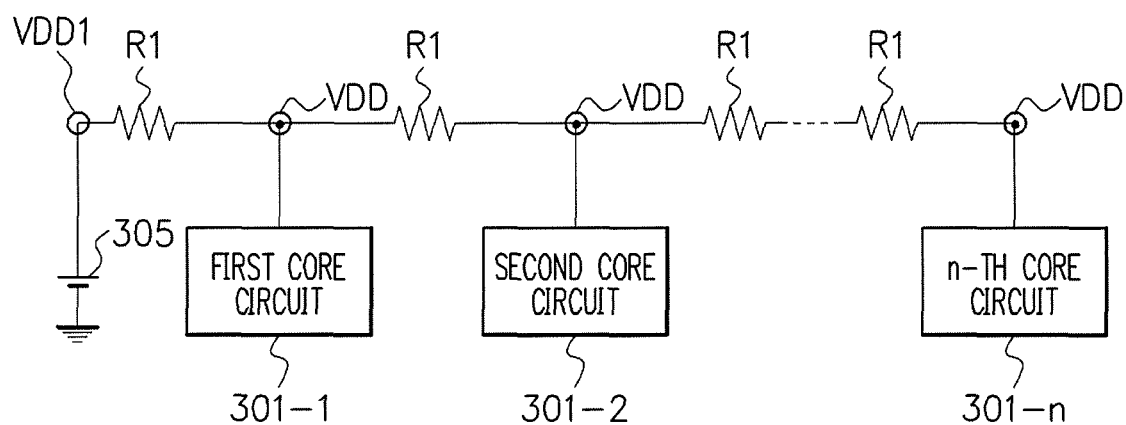

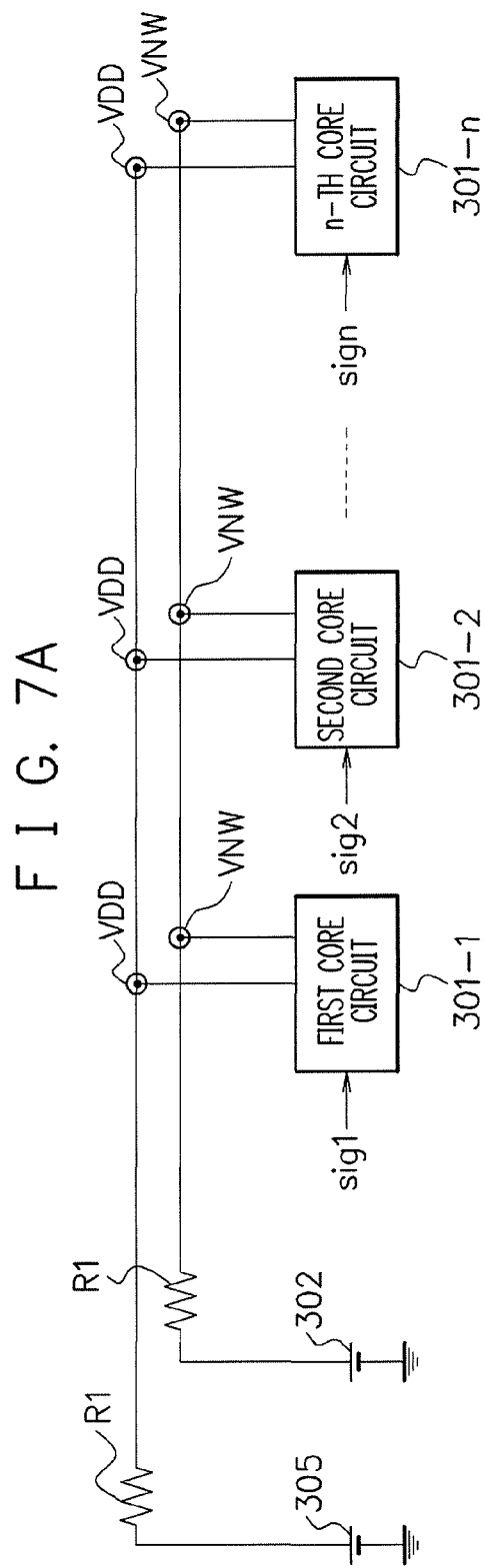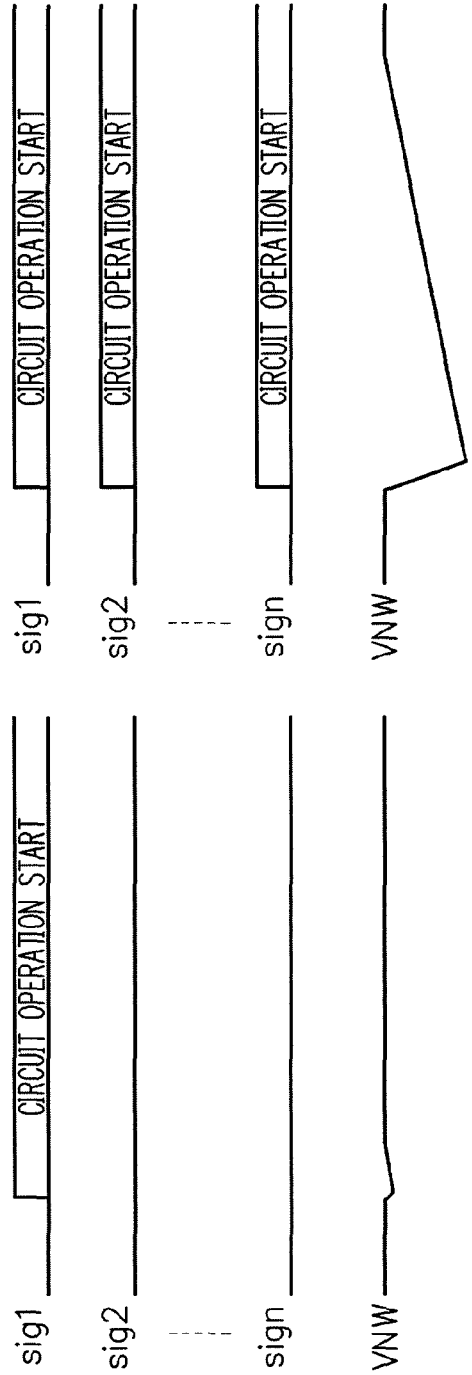

F I G. 11
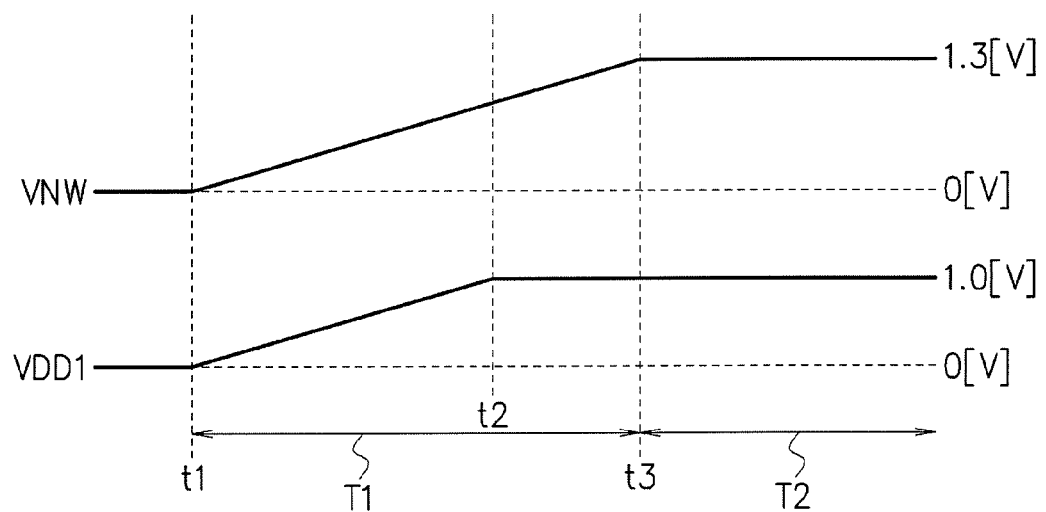
F I G. 12
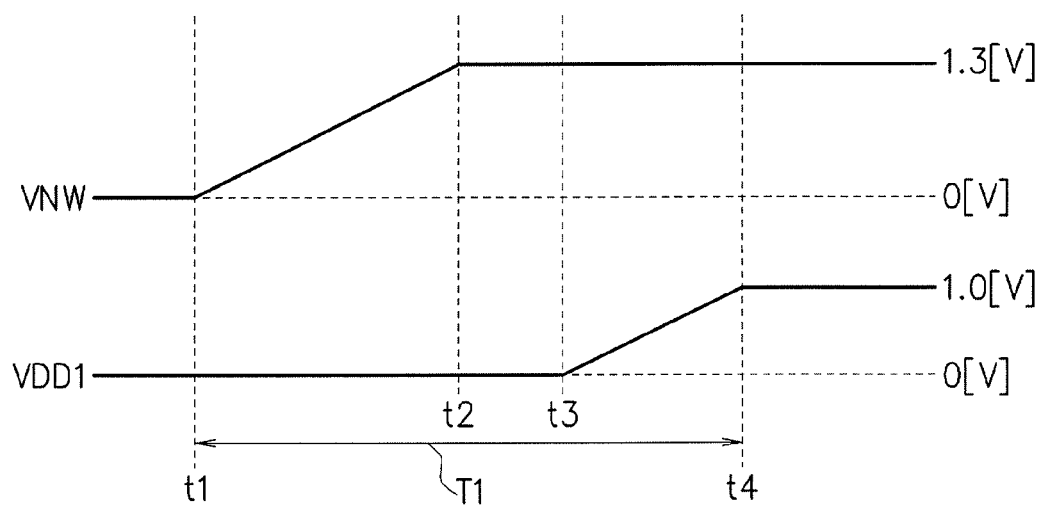

F I G. 15
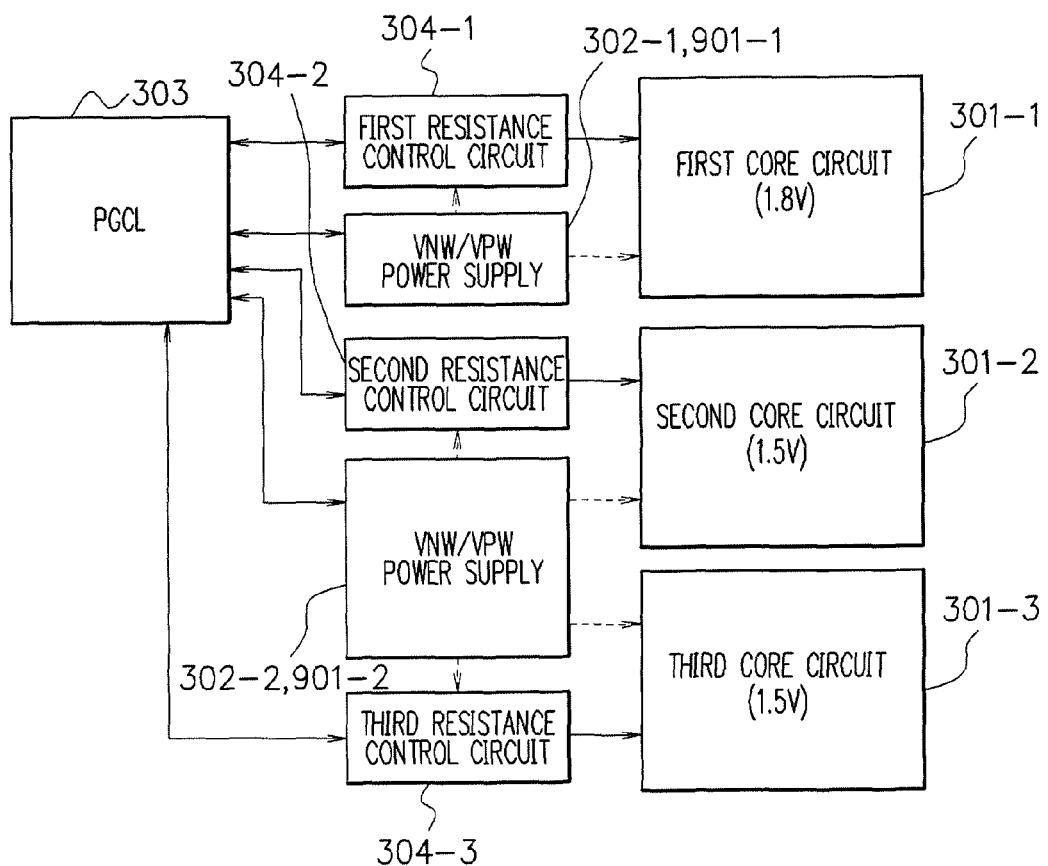

ents (US 9,160,334 B2)

SEMICONDUCTOR DEVICE

CROSS-REFERENCE TO RELATED APPLICATION

This application is based upon and claims the benefit of priority of the prior Japanese Patent Application No. 2013-092470, filed on Apr. 25, 2013, the entire contents of which are incorporated herein by reference.

FIELD

The embodiments discussed herein are directed to a semiconductor device.

BACKGROUND

A semiconductor device including: a transistor in which a source terminal is connected to a voltage supply line of a power supply voltage or a reference voltage; and a substrate bias variable resistance element connected between a semiconductor region where a channel of the transistor is formed and the voltage supply line, is known (for example, refer to Patent Document 1). A substrate bias decision part decides a magnitude relation held by an electric potential of the semiconductor region relative to a source potential by a variable resistance value of the substrate bias variable resistance element.

Besides, a semiconductor integrated circuit device operating based on a control signal, and including a substrate potential generation circuit making a substrate bias deep by pumping an electric charge from a semiconductor substrate at an operation time, and whose output becomes high impedance at a non-operation time, is known (for example, refer to Patent Document 2). A switch circuit operates based on the control signal, becomes a conduction state at the non-operation time of the substrate potential generation circuit to make the electric potential of the semiconductor substrate a power supply voltage, and becomes a non-conduction state at the operation time of the substrate potential generation circuit.

Besides, an A/D converter including a current mirror circuit in which an input analog current is applied on an input terminal, and plural reference current sources respectively connected to plural output terminals of the current mirror circuit is known (for example, refer to Patent Document 3).

[Patent Document 1] Japanese Laid-open Patent Publication No. 2010-80807
[Patent Document 2] Japanese Laid-open Patent Publication No. H9-326688
[Patent Document 3] Japanese Laid-open Patent Publication No. H3-216023

Patent Document 1 discloses an art to apply a substrate bias at low cost without having an additional power supply for the substrate bias generation at inside or outside.

Here, there is a case when the substrate bias, the power supply voltage, or the reference voltage varies caused by the operation of the transistor and so on. In this case, there is a case when a leak current of the transistor increases, and a power consumption increases.

SUMMARY

A semiconductor device includes: a transistor circuit which includes a power supply terminal and a back gate terminal; a variable resistance which is connected between a first voltage terminal and the power supply terminal; and a control circuit which controls the variable resistance based on a digital signal in which a difference voltage is converted when an absolute value of the difference voltage between a voltage of the first voltage terminal and a voltage of the back gate terminal is lower than a threshold value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a view illustrating a configuration example of a semiconductor device according to a first embodiment of the present invention;
FIG. 6 is a view to explain an example in which a voltage of the power supply voltage terminal varies;
FIGS. 7A to 7C are views to explain an example in which a voltage of the back gate terminal varies;
FIG. 11 is a view illustrating a voltage change at a power on time;
FIG. 12 is a view illustrating another voltage change at the power on time;
FIG. 15 is a view illustrating a configuration example of a semiconductor device according to a fifth embodiment of the present invention.

DESCRIPTION OF EMBODIMENTS

First Embodiment

Figure 1:
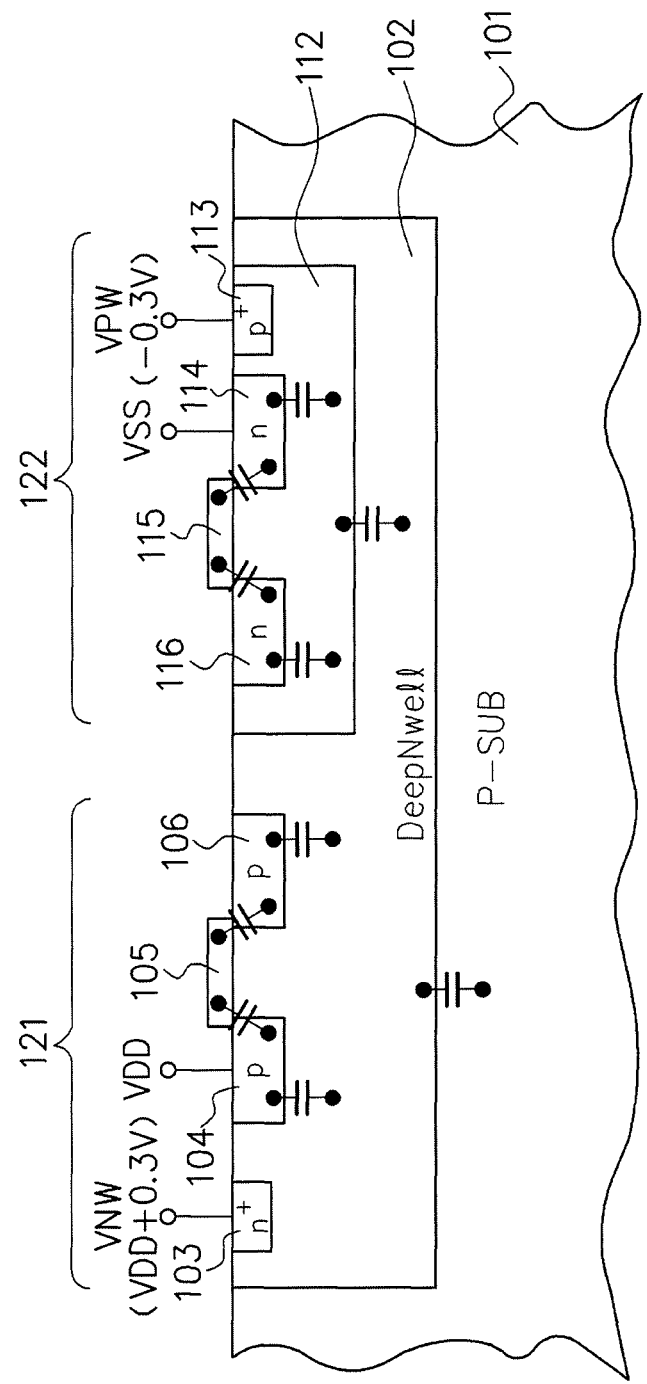
FIG. 1 is a sectional view illustrating a configuration example of a transistor of a semiconductor device.

FIG. 1 is a sectional view illustrating a configuration example of a transistor of a semiconductor device. The semiconductor device includes a p-channel field effect transistor 121 and an n-channel field effect transistor 122. An n-well 102 is provided at a surface of a p-type substrate 101. A p-well 112 is provided inside the n-well 102.

The p-channel field effect transistor 121 includes an $n^+$-type region 103, a source 104 and a gate 105 of a p-type region and a drain 106 of the p-type region. The $n^+$-type region 103, the source 104 and the drain 106 are provided inside the n-well 102. The gate 105 is provided on a channel region between the source 104 and the drain 106 via a gate insulating film. A power supply voltage terminal VDD is a power supply terminal to which a power supply voltage of, for example, 1.0 V is supplied, and is connected to the source 104. A back gate voltage of, for example, 1.3 V is supplied to a back gate terminal VNW, and it is connected to the n-well (back gate) 102 via the $n^+$-type region 103.

The n-channel field effect transistor 122 includes a $p^+$-type region 113, a source 114 and a gate 115 of an n-type region and a drain 116 of the n-type region. The $p^+$-type region 113, the source 114 and the drain 116 are provided inside the p-well 112. The gate 115 is provided on a channel region between the source 114 and the drain 116 via a gate insulating film. A reference voltage terminal VSS is a power supply terminal to which a reference voltage of, for example, "0" (zero) V is supplied, and is connected to the source 114. A back gate voltage of, for example, −0.3 V is supplied to a back gate terminal VPW, and it is connected to the p-well (back gate) 112 via the $p^+$-type region 113.

Next, a cause why voltages of the back gate terminals VNW and VPW vary is described. A joint surface between a p-type semiconductor and an n-type semiconductor is able to be regarded as a capacitance. This capacitance is called as a junction capacitance, and a capacitance value thereof is in proportion to a junction area. Besides, a capacitive component exists between the p-type regions 104, 106 and the gate 105, and the capacitive component also exists between the n-type regions 114, 116 and the gate 115. Electric charge is charged or discharged for theses capacitances when a state of the transistor(s) 121 and/or 122 transits between on and off, and at a state change time of power gating being an operation cutting off a power supply of a circuit, and the voltages of the back gate terminals VNW and VPW vary resulting from the above.

Figure 2A:
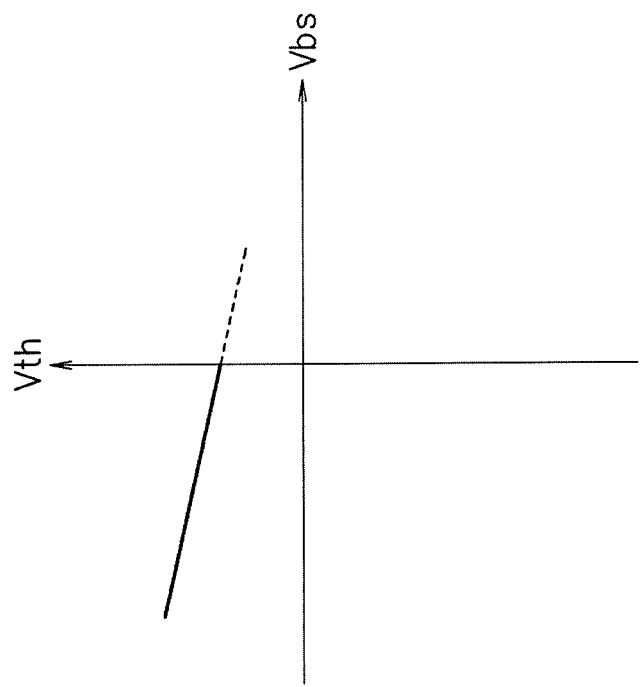
FIGS. 2A and 2B are graphic charts illustrating characteristics of a threshold voltage relative to a difference voltage between a source terminal and a back gate terminal of a field effect transistor.

FIG. 2A is a graphic chart illustrating characteristics of a threshold voltage Vth relative to a difference voltage Vbs of the n-channel field effect transistor 122. The difference voltage Vbs is a voltage in which the voltage of the reference voltage terminal VSS (for example, "0" (zero) V) is subtracted from the voltage of the back gate terminal VPW (for example, −0.3 V). The threshold voltage Vth becomes high as the difference voltage Vbs is low, and the threshold voltage Vth becomes low as the difference voltage Vbs is high. When the transistor 122 is in off state, it is possible to make the threshold voltage Vth high and to make a leak current small by setting the difference voltage Vbs at a low voltage (for example, −0.3 V). However, when the voltage of the back gate terminal VPW varies and the difference voltage Vbs becomes high due to the above-stated cause, the threshold voltage Vth becomes low, the leak current increases, and power consumption increases. A semiconductor device to prevent the increase of the leak current of the n-channel field effect transistor 122 is described later with reference to FIG. 9.

Figure 2B:
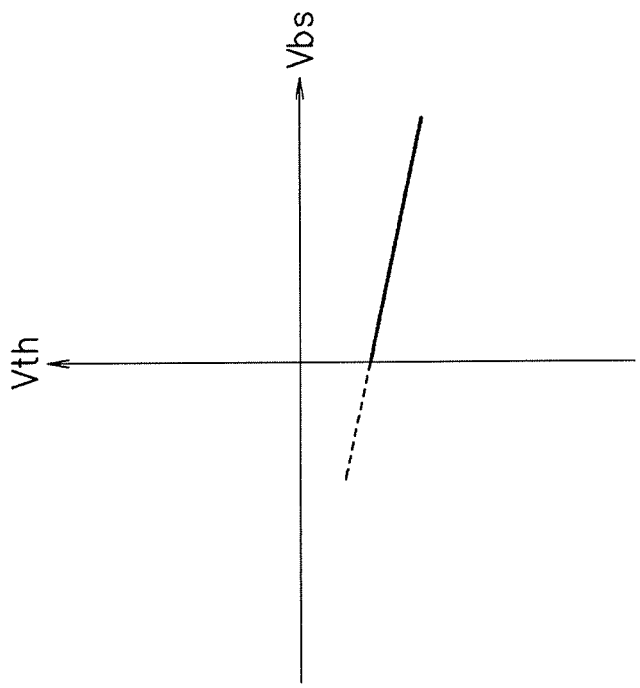

FIG. 2B is a graphic chart illustrating characteristics of the threshold voltage Vth relative to the difference voltage Vbs of the p-channel field effect transistor 121. The difference voltage Vbs is a voltage in which the voltage of the power supply voltage terminal VDD (for example, 1.0 V) is subtracted from the voltage of the back gate terminal VNW (for example, 1.3 V). The threshold voltage Vth becomes high as the difference voltage Vbs is low, and the threshold voltage Vth becomes low as the difference voltage Vbs is high. When the transistor 121 is in off state, it is possible to make the threshold voltage Vth low and to make the leak current small by setting the difference voltage Vbs at a high voltage (for example, 0.3 V). However, when the voltage of the back gate terminal VNW varies and the difference voltage Vbs becomes low due to the above-stated cause, the threshold voltage Vth becomes high, the leak current increases, and the power consumption increases. A semiconductor device to prevent the increase of the leak current of the p-channel field effect transistor 121 is described later with reference to FIG. 3.

FIG. 3 is a view illustrating a configuration example of the semiconductor device according to a first embodiment of the present invention. A core circuit 301 is a transistor circuit including the p-channel field effect transistor 121 and the n-channel field effect transistor 122 in FIG. 1, and includes the power supply voltage terminal VDD and the back gate terminal VNW. A resistance control circuit 304 includes a VDD power supply circuit 305, a difference voltage detection circuit 306, a negative logical product (NAND) circuit 307, a difference voltage A/D converter 308, N-pieces of selectors 309 and a variable resistance 310. A VNW power supply circuit 302 generates a back gate voltage of, for example, 1.3 V, and supplies the back gate voltage to the back gate terminal VNW of the core circuit 301. The VDD power supply circuit 305 generates a power supply voltage of, for example, 1.0 V, and outputs the power supply voltage to a first power supply voltage terminal VDD1. The variable resistance 310 includes a parallel connection circuit of N-pieces of p-channel field effect transistors 311. In each of the N-pieces of p-channel field effect transistors 311, a source is connected to the first power supply voltage terminal VDD1, a gate is connected to an output terminal of each of the N-pieces of selectors 309, and a drain is connected to the power supply voltage terminal VDD of the core circuit 301.

A power gating control logic (PGCL) circuit 303 outputs a power gating signal PG1 to control supply of the power supply voltage to the power supply voltage terminal of the transistor circuit. In a normal mode, the power gating signal PG1 is in low-level, the N-pieces of transistors 311 are turned on, the power supply voltage is supplied to the power supply voltage terminal VDD of the core circuit 301, and thereby, it is possible to set the core circuit 301 in an operation enable state. On the other hand, in a standby mode, the power gating signal PG1 is in high-level, the N-pieces of transistors 311 are turned off, the supply of the power supply voltage to the power supply voltage terminal VDD of the core circuit 301 is stopped, the core circuit 301 is turned into a standby state, and thereby, the power consumption is able to be reduced. The VNW power supply circuit 302 starts the generation of the back gate voltage, outputs a back gate voltage start detection signal PON in low-level until the back gate voltage reaches a predetermined voltage (for example, 1.3 V), and outputs the back gate voltage start detection signal PON in high-level when the back gate voltage reaches the predetermined voltage (for example, 1.3 V).

The difference voltage detection circuit 306 outputs a difference voltage signal DF in low-level when the difference voltage in which the voltage of the first power supply voltage terminal VDD1 is subtracted from the voltage of the back gate terminal VNW is lower than a threshold value (for example, 0.25 V), and outputs the difference voltage signal DF in high-level when the difference voltage is higher than the threshold value. Namely, the difference voltage detection circuit 306 outputs the difference voltage signal DF in low-level when an absolute value of the difference voltage in which the voltage of the first power supply voltage terminal VDD1 is subtracted from the voltage of the back gate terminal VNW is lower than the threshold value, and outputs the difference voltage signal DF in high-level when the absolute value of the difference voltage is higher than the threshold value. The NAND circuit 307 outputs a negative logical product signal ADCNT between the back gate voltage start detection signal PON and the difference voltage signal DF.

The difference voltage A/D converter 308 operates when the signal ADCNT is in high-level, and does not operate when the signal ADCNT is in low-level. The difference voltage A/D converter 308 outputs an N-bit digital control signal CTL in accordance with the difference voltage in which the voltage of the first power supply voltage terminal VDD1 is subtracted from the voltage of the back gate terminal VNW. Specifically, the difference voltage A/D converter 308 makes the number of bit signals in high-level large in the N-bit digital control signal CTL as the difference voltage is lower (as the absolute value of the difference voltage is smaller). Namely, when the difference voltage is low, the number of bit signals in high-level is made large in the N-bit digital control signal CTL, and when the difference voltage is high, the number of bit signals in high-level is made small in the N-bit digital control signal CTL.

The N-pieces of selectors 309 outputs the N-bit control signal CTL to the gates of the N-pieces of p-channel field effect transistors 311 when the signal ADCNT is in high-level, and outputs the power gating signal PG1 to the gates of the N-pieces of p-channel field effect transistors 311 when the signal ADCNT is in low-level. The p-channel field effect transistor 311 is turned on when the gate is in low-level, and is turned off when the gate is in high-level.

Figure 4:
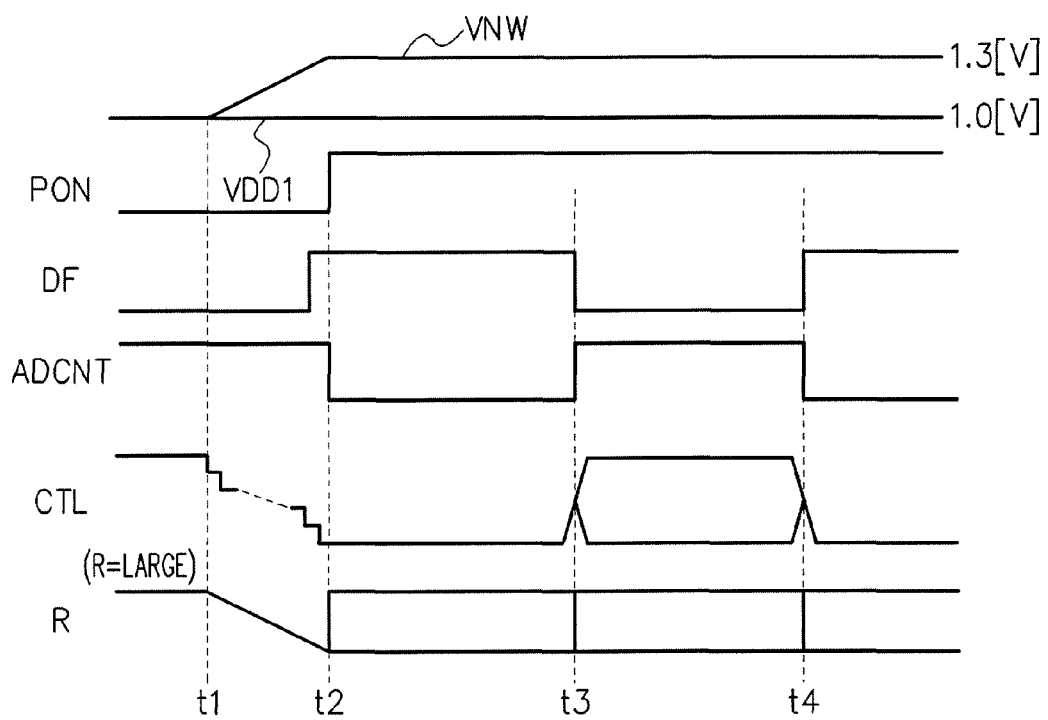
FIG. 4 is a timing chart illustrating an operation example of the semiconductor device in FIG. 3.

FIG. 4 is a timing chart illustrating an operation example of the semiconductor device in FIG. 3. The voltage of the back gate terminal VNW is starting before time t1, does not reach the predetermined voltage (for example, 1.3 V), and the back gate voltage start detection signal PON is in low-level. The voltage of the first power supply voltage terminal VDD1 and the voltage of the back gate terminal VNW are both 1.0 V to be the same. The difference voltage detection circuit 306 outputs the difference voltage signal DF in low-level because the difference voltage ("0" (zero) V) in which the voltage of the first power supply voltage terminal VDD1 (1.0 V) is subtracted from the voltage of the back gate terminal VNW (1.0 V) is lower than the threshold value (for example, 0.25 V). As a result, the signal ADCNT is in high-level, and the N-pieces of selectors 309 select the N-bit control signal CTL and output to the gates of the N-pieces of p-channel field effect transistors 311. The difference voltage A/D converter 308 outputs the N-bit control signal CTL in accordance with the difference voltage ("0" (zero) V) in which the voltage of the first power supply voltage terminal VDD1 (1.0 V) is subtracted from the voltage of the back gate terminal VNW (1.0 V). The difference voltage is "0" (zero) V, and therefore, the number of p-channel field effect transistors 311 which are turned on becomes small, and a resistance value R of the variable resistance 310 becomes large.

When the resistance value of the variable resistance 310 is large, the voltage of the power supply voltage terminal VDD is largely lowered relative to the voltage of the first power supply voltage terminal VDD1 (1.0 V). As a result, the difference voltage Vbs in which the voltage of the power supply voltage terminal VDD is subtracted from the voltage of the back gate terminal VNW becomes higher than "0" (zero) V. When the difference voltage Vbs becomes high, the threshold voltage Vth becomes low as illustrated in FIG. 2B, and it is possible to reduce the leak current of the p-channel field effect transistor 121 and the power consumption.

Next, after the time t1, the voltage of the back gate terminal VNW gradually increases, and the difference voltage in which the voltage of the first power supply voltage terminal VDD1 is subtracted from the voltage of the back gate terminal VNW gradually increases. As a result, the number of p-channel field effect transistors 311 which are turned on gradually increases, and the resistance value R of the variable resistance 310 becomes gradually small. The voltage of the power supply voltage terminal VDD thereby gradually increases, and the difference voltage Vbs in which the voltage of the power supply voltage terminal VDD is subtracted from the voltage of the back gate terminal VNW becomes almost a constant value, and it is possible to reduce the leak current of the p-channel field effect transistor 121 and the power consumption.

After that, when the difference voltage in which the voltage of the first power supply voltage terminal VDD1 (1.0 V) is subtracted from the voltage of the back gate terminal VNW becomes the threshold value (for example, 0.25 V) or more, the difference voltage signal DF is in high-level.

Next, at time t2, the voltage of the back gate terminal VNW reaches a predetermined voltage (for example, 1.3 V), the back gate voltage start detection signal PON is in high-level, and the signal ADCNT is in low-level. Then the selector 309 outputs the power gating signal PG1 to the gates of the N-pieces of p-channel field effect transistors 311. In a normal mode, the power gating signal PG1 is in low-level, all of the N-pieces of p-channel field effect transistors 311 are turned on, and the voltage of the first power supply voltage terminal VDD1 is supplied to the power supply voltage terminal VDD. In this case, the difference voltage Vbs in which the voltage of the power supply voltage terminal VDD is subtracted from the voltage of the back gate terminal VNW is enough high, and therefore, it is possible to make the leak current and the power consumption small. On the other hand, in a standby mode, the power gating signal PG1 is in high-level, all of the N-pieces of p-channel field effect transistors 311 are turned off, the power supply voltage is not supplied to the power supply voltage terminal VDD, and it is possible to reduce the power consumption. As stated above, at times t2 to t3, the p-channel field effect transistor 311 is on/off controlled by the power gating signal PG1.

Figure 5:
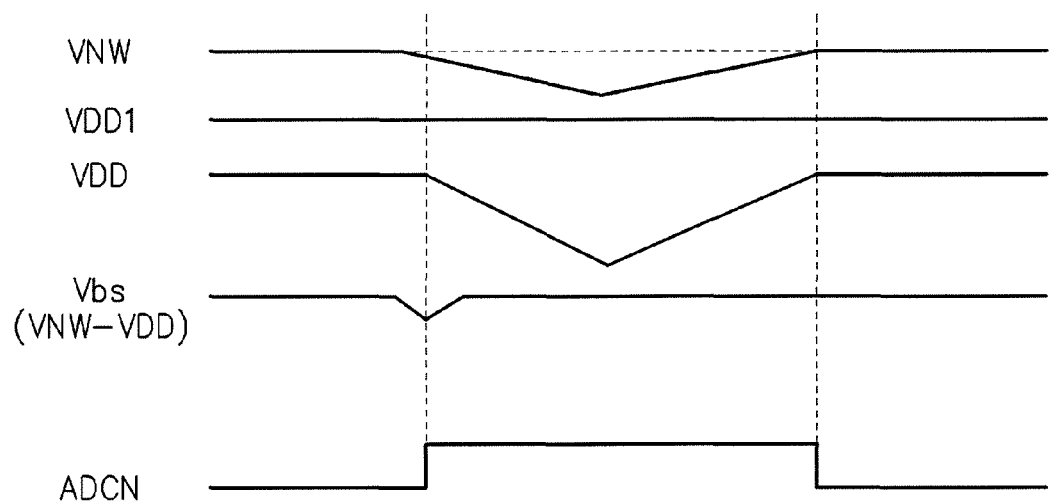
FIG. 5 is a timing chart illustrating the operation example of the semiconductor device in FIG. 3.

Next, details at times t3 to t4 are illustrated in FIG. 5. At the time t3, a case when the voltage of the back gate terminal VNW is lowered due to causes such as the operation of the core circuit 301 is described. The difference voltage detection circuit 306 outputs the difference voltage signal DF in low-level because the difference voltage in which the voltage of the first power supply voltage terminal VDD1 is subtracted from the voltage of the back gate terminal VNW is lower than the threshold value (for example, 0.25 V). As a result, the signal ADCNT is in high-level, the N-pieces of selectors 309 select the N-bit control signal CTL and output to the gates of the N-pieces of p-channel field effect transistors 311. The difference voltage A/D converter 308 outputs the N-bit control signal CTL in accordance with the difference voltage in which the voltage of the first power supply voltage terminal VDD1 is subtracted from the voltage of the back gate terminal VNW, and controls the resistance value R of the variable resistance 310. The lower the difference voltage is, the larger the resistance value R of the variable resistance 310 becomes, the voltage of the power supply voltage terminal VDD becomes relatively low. The higher the difference voltage is, the smaller the resistance value R of the variable resistance 310 becomes, and the voltage of the power supply voltage terminal VDD becomes relatively high. Thereby, the voltage of the power supply voltage terminal VDD is gradually lowered, after that, gradually increases, and the difference voltage Vbs in which the voltage of the power supply voltage terminal VDD is subtracted from the voltage of the back gate terminal VNW is kept at approximately a constant value.

If the variable resistance 310 does not exist, the difference voltage Vbs is also lowered when the voltage of the back gate terminal VNW is lowered at the time t3, as a result, the threshold voltage Vth increases, and the leak current and the power consumption increase as illustrated in FIG. 2B. According to the present embodiment, it is possible to prevent the lowering of the difference voltage Vbs even if the voltage of the back gate terminal VNW is lowered and to prevent the increases of the leak current and the power consumption by providing the variable resistance 310.

Next, at the time t4 in FIG. 4, the voltage of the back gate terminal VNW increases to return to 1.3 V. When the difference voltage in which the voltage of the first power supply voltage terminal VDD1 is subtracted from the voltage of the back gate terminal VNW is the threshold value (for example, 0.25 V) or more, the difference voltage signal DF is in high-level. As a result, the signal ADCNT is in low-level. Then, the selector 309 outputs the power gating signal PG1 to the gates of the N-pieces of p-channel field effect transistors 311 as same as the time t2. When the power gating signal PG1 is in low-level, all of the N-pieces of p-channel field effect transistors 311 are turned on, and the voltage of the first power supply voltage terminal VDD1 is supplied to the power supply voltage terminal VDD. On the other hand, when the power gating signal PG1 is in high-level, all of the N-pieces of p-channel field effect transistors 311 are turned off, the power supply voltage is not supplied to the power supply voltage terminal VDD, and it is possible to reduce the power consumption. As stated above, after the time t4, the p-channel field effect transistor 311 is on/off controlled by the power gating signal PG1.

Besides, after the time t4, when the difference voltage varies within a range from a voltage exceeding the threshold value to a maximum difference voltage of the Vbs, the variable resistance 310 may change at any time in a configuration without the difference voltage detection circuit 306, and therefore, the power supply voltage VDD supplied to the core circuit 301 varies, and there is a possibility in which a malfunction occurs in the core circuit 301. Accordingly, the difference voltage detection circuit 306 is provided, and thereby, all of the p-channel field effect transistors in the variable resistance 310 are continue to be turned on when the core circuit 301 performs a circuit operation under a state in which the difference voltage varies within the range from the voltage exceeding the threshold value set by the difference voltage detection circuit 306 to the maximum difference voltage of the Vbs. In other words, the resistance value of the variable resistance 310 is continue to be kept at a minimum resistance value, and therefore, it is possible to prevent the malfunction of the core circuit 301.

FIG. 6 is a view to explain an example when the voltage of the power supply voltage terminal VDD varies. Each of a first to an n-th core circuit 301-1 to 301-n includes the p-channel field effect transistor 121 and the n-channel field effect transistor 122 in FIG. 1 as same as the core circuit 301 in FIG. 3. The VDD power supply circuit 305 (FIG. 3) is connected to the power supply voltage terminals VDD of the first to n-th core circuits 301-1 to 301-n via wiring resistances R1. The VDD power supply circuit 305 is a power supply circuit having a finite response characteristic and output impedance. A wiring of the VDD power supply circuit 305 is represented only by the resistance R1, but there is a case when a resistance component and an inductor component are included. When the core circuits 301-1 to 301-n shift from an operation state to a stop state, the voltages of the power supply voltage terminals VDD of the core circuits 301-1 to 301-n become high. After that, it takes a long time until the voltages return to a predetermined voltage. Besides, the voltage of the back gate terminal VNW generated by the VNW power supply circuit 302 in FIG. 3 also varies due to the similar reason. When the voltages of the power supply voltage terminals VDD vary, the voltage of the first power supply voltage terminal VDD1 also varies. It is possible to prevent the lowering of the difference voltage Vbs and to prevent the increases of the leak current and the power consumption by controlling the variable resistance 310 as illustrated in FIG. 5 even when the voltage of the first power supply voltage terminal VDD1 increases or the voltage of the back gate terminal VNW decreases.

FIGS. 7A to 7C are views to explain an example when the voltage of the back gate terminal VNW varies. In FIG. 7A, the power supply voltage terminals VDD of the core circuits 301-1 to 301-n are connected to the VDD power supply circuit 305 via the wiring resistance R1 as same as FIG. 6. Besides, the back gate terminals VNW of the core circuits 301-1 to 301-n are connected to the VNW power supply circuit 302 (FIG. 3) via the wiring resistance R1. Voltages sig1 to sign are voltages supplied to the core circuits 301-1 to 301-n, and for example, they are the voltage of the power supply voltage terminal VDD or the voltage of the back gate terminal VNW. When the voltages sig1 to sign change, the voltages of the back gate terminals VNW vary via the capacitances held by the transistors in the core circuits 301-1 to 301-n. As illustrated in FIG. 7B, when only one voltage sig1 varies due to the operation start of one core circuit 301-1, a variation amount (lowering amount) of the voltage of the back gate terminal VNW is relatively small. On the other hand, as illustrated in FIG. 7C, when the n-pieces of the voltages sig1 to sign simultaneously vary due to the operation start of the n-pieces of the core circuits 301-1 to 301-n, the variation amount (lowering amount) of the voltage of the back gate terminal VNW is relatively large, and it takes a long time until the voltage returns to the predetermined voltage (1.3 V). It is also possible to prevent the lowering of the difference voltage Vbs and to prevent the increases of the leak current and the power consumption by controlling the variable resistance 310 as stated above even in the case as stated above.

Second Embodiment

Figure 8:
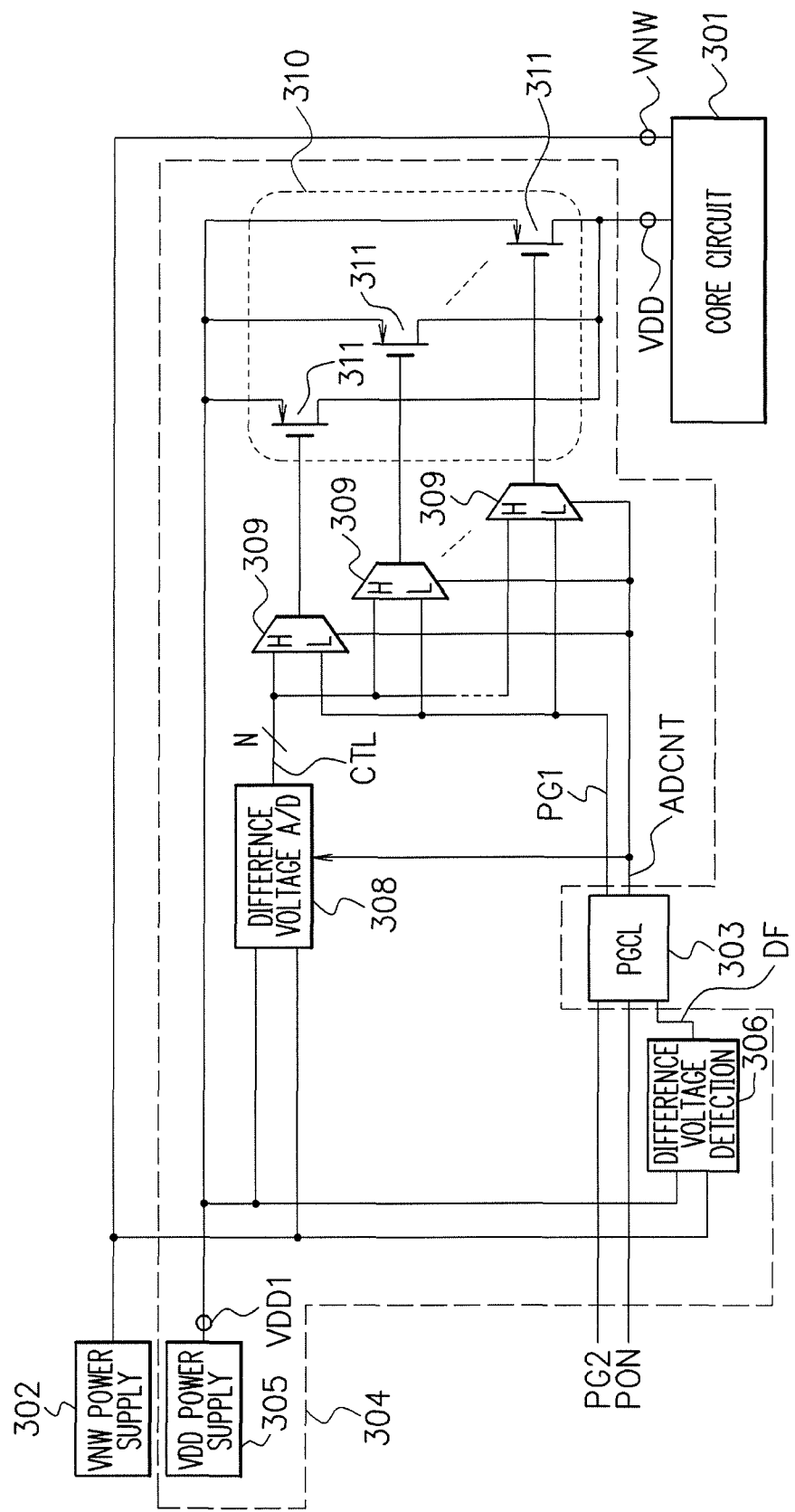
FIG. 8 is a view illustrating a configuration example of a semiconductor device according to a second embodiment of the present invention.

FIG. 8 is a view illustrating a configuration example of a semiconductor device according to a second embodiment of the present invention. The present embodiment (FIG. 8) is one in which the NAND circuit 307 is deleted from the first embodiment (FIG. 3). Hereinafter, points in which the present embodiment is different from the first embodiment are described. The PGCL circuit 303 inputs a control signal PG2, the back gate voltage start detection signal PON, and the difference voltage signal DF, and outputs the power gating signal PG1 and the signal ADCNT. Operations of the present embodiment are the same as the first embodiment.

It is possible for the core circuit 301 to generate the control signal PG2 in accordance with the operation state of itself, and to output the control signal PG2 to the PGCL circuit 303. When the core circuit 301 performs signal processing, there is a case when the core circuit 301 is in the operation state affecting on the signal processing if the voltage of the power supply voltage terminal VDD is varied. The core circuit 301 outputs the control signal PG2 indicating an operation interruption disable state (resistance control invalid) under the operation state as stated above, and the PGCL circuit 303 outputs the power gating signal PG1 in low-level and the signal ADCNT in low level. It is thereby possible for the core circuit 301 to continue the signal processing without changing the resistance value of the variable resistance 310.

Besides, the core circuit 301 performs the signal processing, but there is a case when the core circuit 301 is in the operation state capable of being interrupted immediately. In the operation state as stated above, the core circuit 301 outputs the control signal PG2 indicating an operation interruption enable state, and the PGCL circuit 303 outputs the signal ADCNT in accordance with the back gate voltage start detection signal PON and the difference voltage signal DF as same as the first embodiment. When the signal ADCNT is in high-level, the core circuit 301 once interrupts the signal processing, and the resistance value of the variable resistance 310 is controlled. It is thereby possible to prevent the lowering of the difference voltage Vbs, and to prevent the increases of the leak current and the power consumption.

Besides, there is a case when the core circuit 301 is in the operation state in which the signal processing is not performed. In the operation state as stated above, the core circuit 301 outputs the control signal PG2 indicating the non-operation state, and the PGCL circuit 303 outputs the signal ADCNT in accordance with the back gate voltage start detection signal PON and the difference voltage signal DF as same as the first embodiment. When the signal ADCNT is in high-level, the resistance value of the variable resistance 310 is controlled. It is thereby possible to prevent the lowering of the difference voltage Vbs, and to prevent the increases of the leak current and the power consumption.

Third Embodiment

Figure 9:
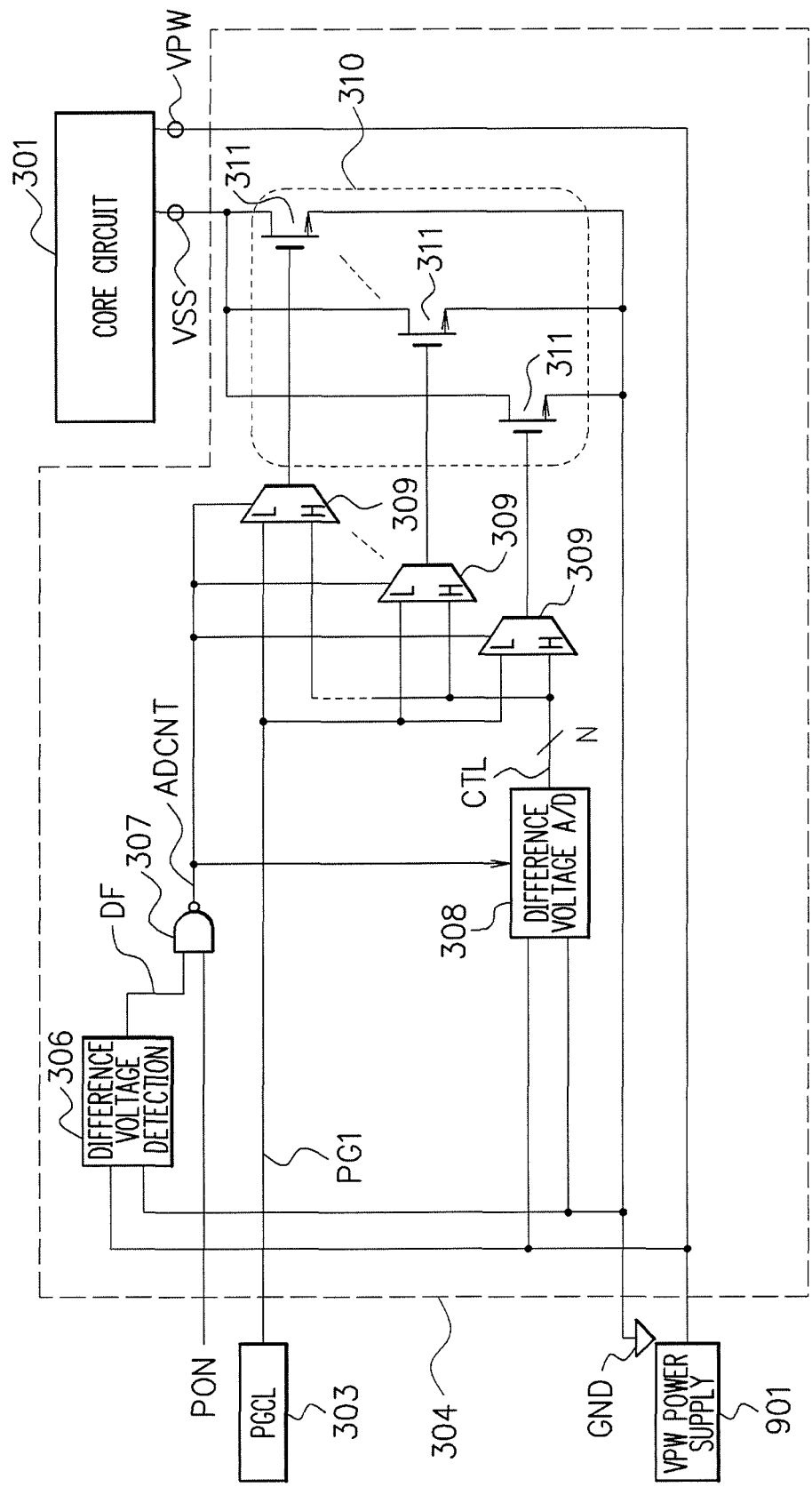
FIG. 9 is a view illustrating a configuration example of a semiconductor device according to a third embodiment of the present invention.

FIG. 9 is a view illustrating a configuration example of a semiconductor device according to a third embodiment of the present invention. In the first and second embodiments, an example in which the leak current of the p-channel field effect transistor 121 in the core circuit 301 is reduced is described. In the present embodiment, an example in which the leak current of the n-channel field effect transistor 122 in the core circuit 301 is reduced is described. Hereinafter, points in which the present embodiment is different from the first and second embodiments are described. The core circuit 301 includes the n-channel field effect transistor 122 and the p-channel field effect transistor 121 in FIG. 1. The reference voltage terminal VSS is connected to the source 114 of the n-channel field effect transistor 122. The back gate terminal VPW is connected to the back gate 112 of the n-channel field effect transistor 122. A VPW power supply circuit 901 supplies the back gate voltage (for example, −0.3 V) to the back gate terminal VPW. The variable resistance 310 includes a parallel connection circuit of N-pieces of n-channel field effect transistors 311. In each of the N-pieces of n-channel field effect transistors 311, a drain is connected to the reference voltage terminal VSS, and a source is connected to a first ground voltage terminal GND.

The PGCL circuit 303 outputs the power gating signal PG1. In a normal mode, the power gating signal PG1 is in high-level, the N-pieces of transistors 311 are turned on, the reference voltage is supplied to the reference voltage terminal VSS of the core circuit 301, and it is possible to set the core circuit 301 into an operation enable state. On the other hand, in a standby mode, the power gating signal PG1 is in low-level, the N-pieces of transistors 311 are turned off, the supply of the reference voltage to the reference voltage terminal VSS of the core circuit 301 is stopped, the core circuit 301 is set into a standby state, and it is possible to reduce the power consumption. The VPW power supply circuit 901 starts a generation of the back gate voltage, outputs the back gate voltage start detection signal PON in low-level until the back gate voltage reaches the predetermined voltage (for example, −0.3 V), and outputs the back gate voltage start detection signal PON in high-level when the back gate voltage reaches a predetermined voltage (for example, −0.3 V).

The difference voltage detection circuit 306 outputs the difference voltage signal DF in low-level when the difference voltage in which a voltage of the first ground voltage terminal GND (for example, "0" (zero) V) is subtracted from a voltage of the back gate terminal VPW (for example, −0.3 V) is higher than a threshold value (for example, −0.25 V), and outputs the difference voltage signal DF in high-level when the difference voltage is lower than the threshold value. Namely, the difference voltage detection circuit 306 outputs the difference voltage signal DF in low-level when an absolute value of the difference voltage in which the voltage of the first ground voltage terminal GND is subtracted from the voltage of the back gate terminal VPW is lower than the threshold value, and outputs the difference voltage signal DF in high-level when the absolute value of the difference voltage is higher than the threshold value. The NAND circuit 307 outputs the negative logical product signal ADCNT between the back gate voltage start detection signal PON and the difference voltage signal DF.

The difference voltage A/D converter 308 operates when the signal ADCNT is in high-level, and does not operate when the signal ADCNT is in low-level. The difference voltage A/D converter 308 outputs the N-bit digital control signal CTL in accordance with the difference voltage in which the voltage of the first ground voltage terminal GND is subtracted from the voltage of the back gate terminal VPW. Specifically, the difference voltage A/D converter 308 makes the number of bit signals in low-level large in the N-bit digital control signal CTL as the difference voltage is higher (as the absolute value of the difference voltage is smaller). Namely, when the difference voltage is high, it makes the number of bit signals in low-level large in the N-bit digital control signal CTL, and when the difference voltage is low, it makes the number of bit signals in low-level small in the N-bit digital control signal CTL.

The N-pieces of selectors 309 output the N-bit control signal CTL to the gates of the N-pieces of n-channel field effect transistors 311 when the signal ADCNT is in high-level, and output the power gating signal PG1 to the gates of the N-pieces of n-channel field effect transistors 311 when the signal ADCNT is in low-level. The n-channel field effect transistor 311 is turned off when the gate is in low-level, and is turned on when the gate is in high-level.

When the difference voltage in which the voltage of the first ground voltage terminal GND is subtracted from the voltage of the back gate terminal VPW becomes high, the resistance value of the variable resistance 310 is made large, and the voltage of the reference voltage terminal VSS is increased. It is thereby possible to prevent the increase of the difference voltage Vbs in which the voltage of the reference voltage terminal VSS is subtracted from the voltage of the back gate terminal VPW, and as illustrated in FIG. 2A, to prevent the lowering of the threshold voltage Vth and to reduce the leak current of the n-channel field effect transistor 122 and the power consumption.

Fourth Embodiment

Figure 10:
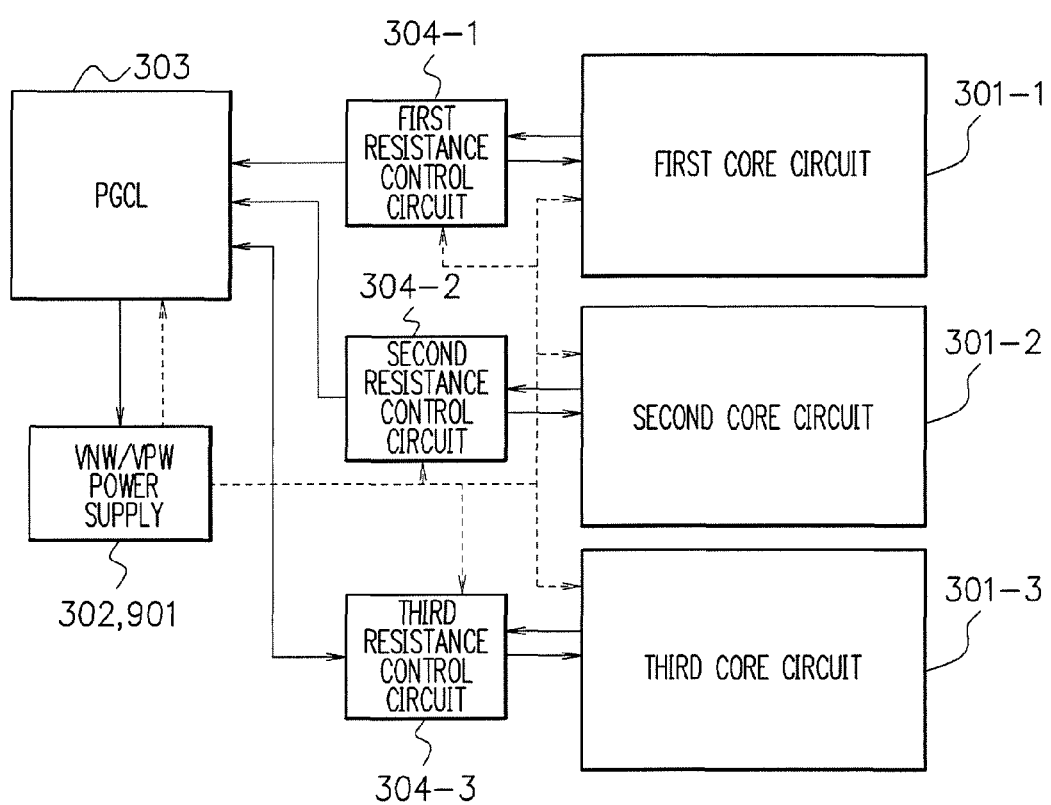
FIG. 10 is a view illustrating a configuration example of a semiconductor device according to a fourth embodiment of the present invention.

FIG. 10 is a view illustrating a configuration example of a semiconductor device according to a fourth embodiment of the present invention. Hereinafter, points in which the present embodiment is different from the first to third embodiments are described. The semiconductor device includes a first to a third core circuit 301-1 to 301-3, a first to a third resistance control circuit 304-1 to 304-3, the PGCL circuit 303, the VNW power supply circuit 302 and the VPW power supply circuit 901. The core circuits 301-1 to 301-3 each include the p-channel field effect transistor 121 and the n-channel field effect transistor 122 in FIG. 1. The first to third resistance control circuits 304-1 to 304-3 each include the resistance control circuit 304 in FIG. 3 and the resistance control circuit 304 in FIG. 9. The PGCL circuit 303 corresponds to the PGCL circuits 303 in FIG. 3, FIG. 8 and FIG. 9. The VNW power supply circuit 302 corresponds to the VNW power supply circuit 302 in FIG. 3. The VPW power supply circuit 901 corresponds to the VPW power supply circuit 901 in FIG. 9.

The VNW power supply circuit 302 supplies the voltage of the back gate terminal VNW to the first to third core circuits 301-1 to 301-3, the first to third resistance control circuits 304-1 to 304-3 and the PGCL circuit 303. The VPW power supply circuit 901 supplies the voltage of the back gate terminal VPW to the first to third core circuits 301-1 to 301-3, the first to third resistance control circuits 304-1 to 304-3 and the PGCL circuit 303. The first to third resistance control circuits 304-1 to 304-3 each control the variable resistance 310, and supply the voltages of the power supply voltage terminal VDD and the reference voltage terminal VSS to the first to third core circuits 301-1 to 301-3.

FIG. 11 is a view illustrating a voltage change at a power on time. At time t1, when the power of the semiconductor device is turned on, the voltage of the first power supply voltage terminal VDD1 and the voltage of the back gate terminal VNW increase from "0" (zero) V. After time t2, the voltage of the first power supply voltage terminal VDD1 keeps at approximately 1.0 V. After time t3, the voltage of the back gate terminal VNW keeps at approximately 1.3 V. At a period T1, the difference voltage in which the voltage of the first power supply voltage terminal VDD1 is subtracted from the voltage of the back gate terminal VNW is lower than the threshold value, and therefore, it is possible to prevent the increases of the leak current and the power consumption by controlling the variable resistance 310 and lowering the voltage of the power supply voltage terminal VDD. At a period T2, the difference voltage in which the voltage of the first power supply voltage terminal VDD1 is subtracted from the voltage of the back gate terminal VNW is higher than the threshold value, and therefore, all of the transistors 311 are turned on, and the power supply voltage is supplied to the power supply voltage terminal VDD.

FIG. 12 is a view illustrating another voltage change at the power on time. At time t1, when the power of the semiconductor device is turned on, the voltage of the back gate terminal VNW increases from "0" (zero) V. After time t2, the voltage of the back gate terminal VNW keeps at approximately 1.3 V. Next, at time t3, the VDD power supply circuit 305 is able to increase the voltage of the first power supply voltage terminal VDD1 from "0" (zero) V by power gating. After time t4, the voltage of the first power supply voltage terminal VDD1 keeps at approximately 1.0 V. At a period T1, the difference voltage in which the voltage of the first power supply voltage terminal VDD1 is subtracted from the voltage of the back gate terminal VNW is constantly higher than the threshold value, and therefore, all of the transistors 311 are turned on, and the power supply voltage is supplied to the power supply voltage terminal VDD.

Namely, after the time t2, the voltage of the back gate terminal VNW keeps at approximately 1.3 V, and therefore, it is possible to prevent the increases of the leak current and the power consumption without controlling the variable resistance 310.

Figure 13:
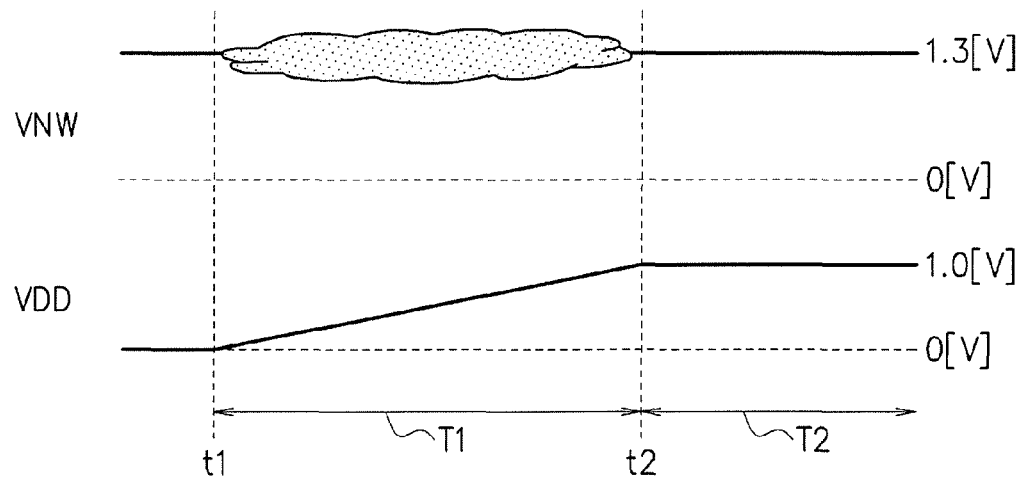
FIG. 13 is a view illustrating a variation example of the voltage of the back gate terminal.

FIG. 13 is a view illustrating a variation example of the voltage of the back gate terminal VNW. Before time t1, the voltage of the back gate terminal VNW is at approximately 1.3 V. At the time t1, the power gating signal PG1 changes from high-level to low-level, and the voltage of the power supply voltage terminal VDD increases from "0" (zero) V. Then the voltage of the back gate terminal VNW is lowered affected by the above. Accordingly, at a period T1, there is a case when the difference voltage in which the voltage of the first power supply voltage terminal VDD1 is subtracted from the voltage of the back gate terminal VNW becomes lower than the threshold value, and therefore, it is possible to prevent the increases of the leak current and the power consumption by controlling the variable resistance 310 and lowering the voltage of the power supply voltage terminal VDD. After time t2, the voltage of the power supply voltage terminal VDD keeps at approximately 1.0 V. At a period T2, the difference voltage in which the voltage of the first power supply voltage terminal VDD1 is subtracted from the voltage of the back gate terminal VNW is higher than the threshold value, and therefore, all of the transistors 311 are turned on, and the power supply voltage is supplied to the power supply voltage terminal VDD.

Figure 14:
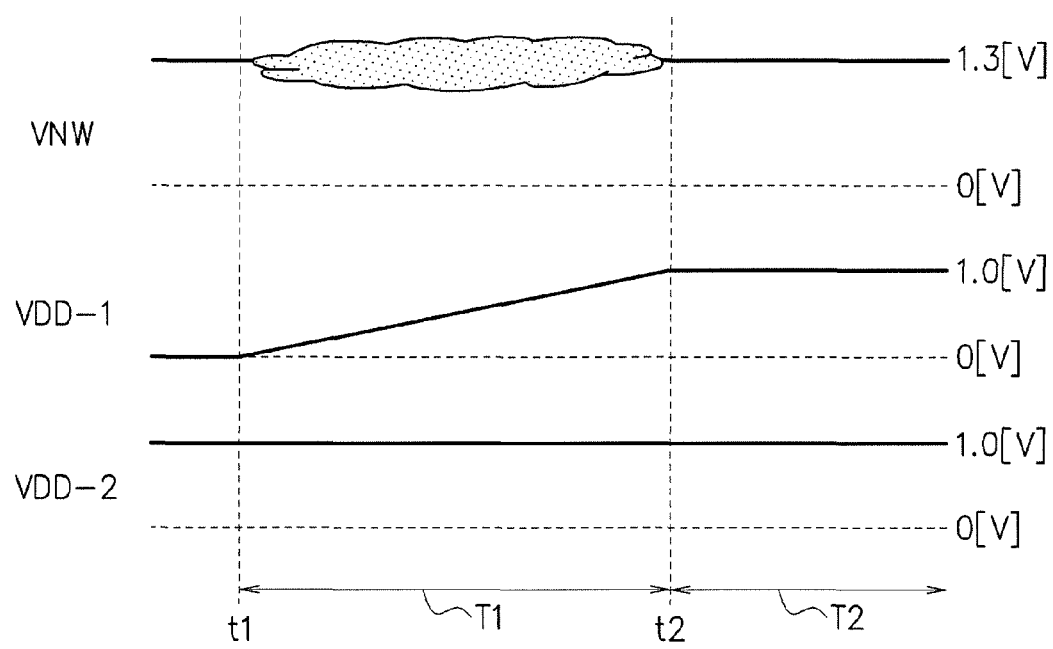
FIG. 14 is a view illustrating another variation example of the voltage of the back gate terminal.

FIG. 14 is a view illustrating another variation example of the voltage of the back gate terminal VNW. A power supply voltage terminal VDD-1 represents the power supply voltage terminal VDD of the first core circuit 301-1. A power supply voltage terminal VDD-2 represents the power supply voltage terminal VDD of the second core circuit 301-2. Before time t1, the voltage of the back gate terminal VNW is at approximately 1.3 V, the power supply voltage terminal VDD-1 is at "0" (zero) V, and the power supply voltage terminal VDD-2 is at approximately 1.0 V. At the time t1, the power gating signal PG1 changes from high-level to low-level, and the voltage of the power supply voltage terminal VDD-1 increases from "0" (zero) V. Then the voltage of the back gate terminal VNW is lowered affected by the above. At a period T1, there is a case when the difference voltage in which the voltage of the first power supply voltage terminal VDD1 is subtracted from the voltage of the back gate terminal VNW becomes lower than the threshold value at each of the first resistance control circuit 304-1 and the second resistance control circuit 304-2, and therefore, it is possible to prevent the increases of the leak current and the power consumption by controlling the variable resistance 310 and lowering the voltages of the power supply voltage terminal VDD-1 of the first core circuit 301-1 and the power supply voltage terminal VDD-2 of the second core circuit 301-2. After time t2, the voltage of the power supply voltage terminal VDD-1 of the first core circuit 301-1 keeps at approximately 1.0 V. At a period T2, the difference voltage in which the voltage of the first power supply voltage terminal VDD1 is subtracted from the voltage of the back gate terminal VNW is higher than the threshold value in each of the first resistance control circuit 304-1 and the second resistance control circuit 304-2, and therefore, all of the transistors 311 are turned on, and the power supply voltage is supplied to the power supply voltage terminal VDD-1 of the first core circuit 301-1 and the power supply voltage terminal VDD-2 of the second core circuit 301-2.

As stated above, in the semiconductor device having the plural core circuits, the variable resistance 310 is controlled such that the absolute value of the difference voltage Vbs between the voltage of the power supply terminal VDD and the voltage of the back gate terminal VNW becomes higher than the threshold value when the difference voltage between the voltage of the first voltage terminal VDD1 and the voltage of the back gate terminal VNW is lower than the threshold value also for the voltage variation of the other core circuits when the power gating operation of a certain core circuit is performed. It is thereby possible to keep the threshold voltage Vth low and to prevent the increases of the leak current of the p-channel field effect transistor 121 and the power consumption as illustrated in FIG. 2B.

Fifth Embodiment

FIG. 15 is a view illustrating a configuration example of a semiconductor device according to a fifth embodiment of the present invention. Hereinafter, points in which the present embodiment is different from the fourth embodiment are described. The semiconductor device operates at two kinds of power supply voltages of 1.8 V and 1.5 V. The first core circuit 301-1 operates at the power supply voltage of 1.8 V. The second core circuit 301-2 and the third core circuit 301-3 operate at the power supply voltage of 1.5 V. The first resistance control circuit 304-1 controls resistance, and supplies the power supply voltage of 1.8 V to the power supply voltage terminal VDD of the first core circuit 301-1. The second resistance control circuit 304-2 controls resistance, and supplies the power supply voltage of 1.5 V to the power supply voltage terminal VDD of the second core circuit 301-2. The third resistance control circuit 304-3 controls resistance, and supplies the power supply voltage of 1.5 V to the power supply voltage terminal VDD of the third core circuit 301-3. The VNW power supply circuit 302-1 supplies the back gate voltage of 1.8 V+0.3 V to the back gate terminal VNW of the first core circuit 301-1 and the first resistance control circuit 304-1. A VPW power supply circuit 901-1 supplies the back gate voltage of –0.3 V to the back gate terminal VPW of the first core circuit 301-1 and the first resistance control circuit 304-1. A VNW power supply circuit 302-2 supplies the back gate voltage of 1.5 V+0.3 V to the back gate terminal VNW of the second core circuit 301-2, the back gate terminal VNW of the third core circuit 301-3, the second resistance control circuit 304-2 and the third resistance control circuit 304-3. A VPW power supply circuit 901-2 supplies the back gate voltage of –0.3 V to the back gate terminal VPW of the second core circuit 301-2, the back gate terminal VPW of the third core circuit 301-3, the second resistance control circuit 304-2 and the third resistance control circuit 304-3.

As is already described in the fourth embodiment, for example, when the power gating operation of the third core circuit 301-3 is started while the first core circuit 301-1 and the second core circuit 301-2 are in operation, there is a case when the variation of the voltage almost similar to the variation of the voltage as illustrated in FIG. 14 occurs. In such a case, it is possible to prevent the increases of the leak current and the power consumption for the third resistance control circuit 304-3 connected to the power supply voltage terminal of the third core circuit 301-3 by controlling the variable resistance 310 and lowering the voltage of the power supply voltage terminal as same as the fourth embodiment, because at a period T1, there is a case when a difference voltage in which a voltage of the power supply voltage terminal of the third core circuit is subtracted from the voltage of the back gate terminal VNW becomes lower than the threshold value. After time t2, the voltage of the power supply voltage terminal is kept at approximately 1.5 V. At a period T2, the third resistance control circuit 304-3 turns on all of the transistors 311, and supplies the power supply voltage to the power supply voltage terminal VDD-2 because the difference voltage in which the voltage of the first power supply voltage terminal VDD1 is subtracted from the voltage of the back gate terminal VNW is higher than the threshold value.

Sixth Embodiment

Figure 16:
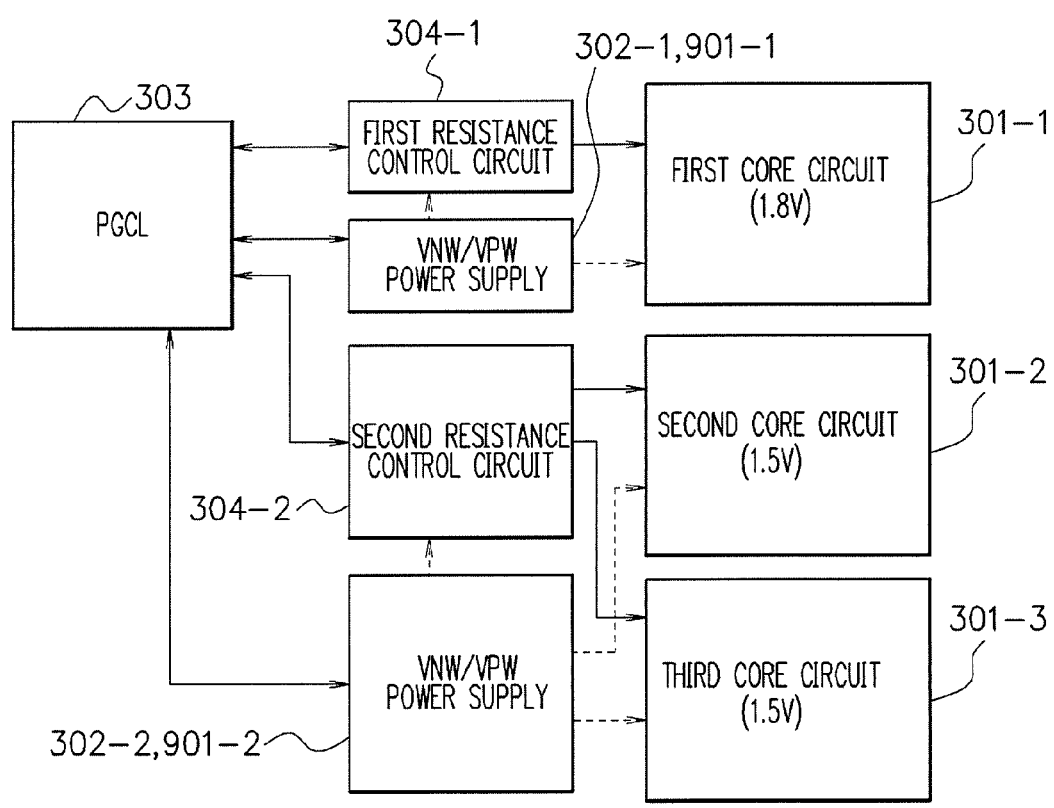
FIG. 16 is a view illustrating a configuration example of a semiconductor device according to a sixth embodiment of the present invention.

FIG. 16 is a view illustrating a configuration example of a semiconductor device according to a sixth embodiment of the present invention. Hereinafter, points in which the present embodiment is different from the fifth embodiment are described. The semiconductor device operates by two kinds of power supply voltages of 1.8 V and 1.5 V. The first core circuit 301-1 operates by the power supply voltage of 1.8 V. The second core circuit 301-2 and the third core circuit 301-3 operate by the power supply voltage of 1.5 V. The first resistance control circuit 304-1 controls resistance, and supplies the power supply voltage of 1.8 V to the power supply voltage terminal VDD of the first core circuit 301-1. The second resistance control circuit 304-2 controls resistance, and supplies the power supply voltage of 1.5 V to the power supply voltage terminals VDD of the second core circuit 301-2 and the third core circuit 301-3. The VNW power supply circuit 302-1 supplies the back gate voltage of 1.8 V+0.3 V to the back gate terminal VNW of the first core circuit 301-1 and the first resistance control circuit 304-1. The VPW power supply circuit 901-1 supplies the back gate voltage of –0.3 V to the back gate terminal VPW of the first core circuit 301-1 and the first resistance control circuit 304-1. The VNW power supply circuit 302-2 supplies the back gate voltage of 1.5 V+0.3 V to the back gate terminal VNW of the second core circuit 301-2, the back gate terminal VNW of the third core circuit 301-3, and the second resistance control circuit 304-2. The VPW power supply circuit 901-2 supplies the back gate voltage of –0.3 V to the back gate terminal VPW of the second core circuit 301-2, the back gate terminal VPW of the third core circuit 301-3, and the second resistance control circuit 304-2.

Operations as described in the fifth embodiment are possible, and the detailed description is not given.

As stated above, the semiconductor device in FIG. 3 controls the variable resistance 310 such that the absolute value of the difference voltage Vbs between the voltage of the power supply terminal VDD and the voltage of the back gate terminal VNW becomes higher than the threshold value when the difference voltage between the voltage of the first voltage terminal VDD1 and the voltage of the back gate terminal VNW is lower than the threshold value. It is thereby possible to keep the threshold voltage Vth low and to prevent the increases of the leak current of the p-channel field effect transistor 121 and the power consumption as illustrated in FIG. 2B.

Besides, the semiconductor device in FIG. 9 controls the variable resistance 310 such that the difference voltage Vbs between the voltage of the power supply terminal GND (VSS) and the voltage of the back gate terminal VPW becomes higher than the threshold value when the absolute value of the difference voltage between the voltage of the first voltage terminal GND (VSS) and the voltage of the back gate terminal VPW is lower than the threshold value. It is thereby possible to keep the threshold voltage Vth high and to prevent the increases of the leak current of the n-channel field effect transistor 122 and the power consumption as illustrated in FIG. 2A.

Incidentally, the above-described embodiments are to be considered in all respects as illustrative and no restrictive. Namely, the present invention may be embodied in other specific forms without departing from the spirit or essential characteristics thereof.

It is possible to prevent an increase of a leak current resulting from variation of a voltage of a power supply terminal and/or a back gate terminal of a transistor circuit and to reduce power consumption by controlling a variable resistance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
    a transistor circuit configured to include a power supply terminal and a back gate terminal;
    a variable resistance configured to be connected between a first voltage terminal and the power supply terminal; and
    a control circuit configured to control the variable resistance based on a digital signal in which a difference voltage is converted when an absolute value of the difference voltage between a voltage of the first voltage terminal and a voltage of the back gate terminal is lower than a threshold value.

2. The semiconductor device according to claim 1,
    wherein the variable resistance includes a parallel connection circuit of plural field effect transistors, and
    the control circuit controls a resistance value of the variable resistance by controlling the number of plural field effect transistors which are conducted.

3. The semiconductor device according to claim 2,
    wherein the control circuit controls the number of plural field effect transistors which are conducted when the absolute value of the difference voltage is lower than the threshold value, and controls conduction/non-conduction of the plural field effect transistors based on a first control signal input from outside when the absolute value of the difference voltage is higher than the threshold value.

4. The semiconductor device according to claim 1,
    wherein the control circuit controls the variable resistance in accordance with a second control signal indicating whether or not an operation of the transistor circuit is able to be interrupted.

5. The semiconductor device according to claim 1,
    wherein the transistor circuit includes a p-channel field effect transistor, and
    the power supply terminal is a power supply voltage terminal at a high potential side.

6. The semiconductor device according to claim 5,
    wherein the back gate terminal is connected to an n-well where the p-channel field effect transistor is formed, and
    the power supply voltage terminal is connected to a source of the p-channel field effect transistor.

7. The semiconductor device according to claim 1,
    wherein the transistor circuit includes an n-channel field effect transistor, and
    the power supply terminal is a reference voltage terminal.

8. The semiconductor device according to claim 7,
    wherein the back gate terminal is connected to a p-well where the n-channel field effect transistor is formed, and
    the reference voltage terminal is connected to a source of the n-channel field effect transistor.

9. A semiconductor device, comprising:
    a transistor circuit configured to include a power supply terminal and a back gate terminal;
    a variable resistance configured to include plural field effect transistors and configured to be connected between a first voltage terminal and the power supply terminal;
    a difference voltage detection circuit configured to detect a difference voltage between a first voltage applied to the first voltage terminal and a second voltage applied to the back gate terminal; and
    a control circuit configured to control the variable resistance based on a digital signal in which the difference voltage is converted,
    wherein the control circuit turns all of the plural field effect transistors of the variable resistance into on-state when the second voltage reaches a reference voltage and the difference voltage is a first threshold value or more.

10. The semiconductor device according to claim 9,
    wherein the control circuit turns all of the plural field effect transistors of the variable resistance into on-state when the difference voltage is a voltage value of a second threshold value or more which is lower than the first threshold value.

11. A semiconductor device, comprising:
    plural transistor circuits each of which includes a power supply terminal and a back gate terminal;
    plural variable resistances each of which is connected between a first voltage terminal and the power supply terminal; and
    plural control circuits each of which controls each of the plural variable resistances based on a digital signal in which a difference voltage is converted when each absolute value of the difference voltage between a voltage of the first voltage terminal and a voltage of the back gate terminal is lower than a threshold value,
    wherein whether or not the voltage of the back gate terminal is a reference voltage is detected, and whether or not a control of the plural control circuits is enabled is determined in accordance with a detection result.

12. The semiconductor device according to claim 11,
    wherein the plural variable resistances each of which includes plural field effect transistors,
    the variable resistance is controlled based on the control circuit controlling the variable resistance connected to the transistor circuit when the transistor circuit starts operation before the voltage of the back gate terminal becomes a reference voltage, and
    all of the plural field-effect transistors of the variable resistance connected to the transistor circuit are turned into on-state when the transistor circuit starts operation when the voltage of the back gate terminal is the reference voltage or more.

* * * * *